US011536914B2

(12) United States Patent
Bian et al.

(10) Patent No.: US 11,536,914 B2
(45) Date of Patent: Dec. 27, 2022

(54) PHOTODETECTOR ARRAY WITH DIFFRACTION GRATINGS HAVING DIFFERENT PITCHES

(71) Applicant: GLOBALFOUNDRIES U.S. Inc., Santa Clara, CA (US)

(72) Inventors: Yusheng Bian, Ballston Lake, NY (US); Siva P. Adusumilli, South Burlington, VT (US); Mark D. Levy, Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 51 days.

(21) Appl. No.: 17/099,834

(22) Filed: Nov. 17, 2020

(65) Prior Publication Data

US 2022/0155535 A1 May 19, 2022

(51) Int. Cl.
| G02B 6/42 | (2006.01) |
| H01L 31/0256 | (2006.01) |
| H01L 31/02 | (2006.01) |
| G02B 6/12 | (2006.01) |

(52) U.S. Cl.
CPC ...... *G02B 6/4204* (2013.01); *H01L 31/02024* (2013.01); *H01L 31/0256* (2013.01); *G02B 2006/12061* (2013.01); *G02B 2006/12107* (2013.01)

(58) Field of Classification Search
CPC ........ G02B 6/4204; G02B 2006/12061; G02B 2006/12107
See application file for complete search history.

(56) References Cited

U.S. PATENT DOCUMENTS

| 5,315,128 A | 5/1994 | Hunt et al. | |
| 8,368,995 B2 | 2/2013 | Dallesasse et al. | |
| 8,835,851 B2* | 9/2014 | Lee | B82Y 20/00 |
| | | | 250/338.4 |
| 9,496,435 B2 | 11/2016 | Wang et al. | |
| 9,530,905 B2 | 12/2016 | Wang et al. | |
| 2002/0041734 A1* | 4/2002 | Worchesky | G02B 6/12007 |
| | | | 385/24 |
| 2009/0184232 A1* | 7/2009 | Kubiak | G01J 1/4228 |
| | | | 250/339.01 |
| 2009/0310913 A1 | 12/2009 | Bidnyk et al. | |

(Continued)

OTHER PUBLICATIONS

Giewont et al., "300-mm Monolithic Silicon Photonics Foundry Technology", IEEE Journal Of Selected Topics In Quantum Electronics, vol. 25, No. 5, Sep./Oct. 2019, pp. 2-12.

(Continued)

*Primary Examiner* — Tina M Wong
(74) *Attorney, Agent, or Firm* — Anthony Canale; Hoffman Warnick LLC

(57) ABSTRACT

A photodetector array includes a substrate, and an array of pixels over the substrate. Each pixel includes a set of diffraction gratings directly on a semiconductor photodetector. A pitch of the set of diffraction gratings associated with each pixel in the array of pixels are different to enable each pixel to detect a specific wavelength of light different than other pixels of the array of pixels. An air cavity may be provided in the substrate under the germanium photodetector to improve light absorption. A method of forming the photodetector array is also disclosed.

19 Claims, 10 Drawing Sheets

(56) References Cited

U.S. PATENT DOCUMENTS

| | | | |
|---|---|---|---|
| 2017/0108375 A1* | 4/2017 | Brueck | G02B 6/124 |
| 2017/0207600 A1 | 7/2017 | Klamkin et al. | |
| 2018/0180468 A1* | 6/2018 | Wang | G01J 1/0242 |
| 2018/0191953 A1* | 7/2018 | Stork | G06K 9/6215 |
| 2019/0257987 A1* | 8/2019 | Saari | H01L 27/14645 |
| 2020/0393616 A1* | 12/2020 | Schmid | G01N 21/6428 |

OTHER PUBLICATIONS

Rakowski et al., "45nm CMOS-Silicon Photonics Monolithic Technology (45CLO) for next generation, low power and high speed optical interconnects", GLOBALFOUNDRIES, pp. 1-3.

"Sony develops back-illuminated CMOS image sensor, realizing high picture quality, nearly twofold sensitivity(*1) and low noise", https://www.sony.net/SonyInfo/News/Press/200806/08-069E/, Jun. 11, 2008, pp. 1-3.

* cited by examiner

PHOTODETECTOR ARRAY WITH DIFFRACTION GRATINGS HAVING DIFFERENT PITCHES

BACKGROUND

The present disclosure relates to photodetector arrays, and more specifically, to a photodetector array including an array of pixels over a substrate with each pixel including a set of diffraction gratings upon a semiconductor photodetector.

Photodetector arrays are used in photonic integrated circuits to convert light to an electric signal. One challenge with current photodetector arrays is that they are incapable of selectively absorbing and converting an incoming optical signal (light) with different wavelengths. Current photodetector arrays also use silicon diffraction gratings in-line with the optical signal, which creates back-reflection.

SUMMARY

An aspect of the disclosure is directed to a structure, comprising: a substrate; and an array of pixels over the substrate, each pixel including a set of diffraction gratings directly on a semiconductor photodetector, wherein a pitch of the set of diffraction gratings associated with each pixel in the array of pixels are different to enable each pixel to detect a specific wavelength of light different than other pixels of the array of pixels.

Another aspect of the disclosure includes a structure, comprising: a substrate; an array of pixels over the substrate, each pixel including a set of diffraction gratings directly on a semiconductor photodetector, wherein each set of diffraction gratings includes one of polysilicon and silicon; a trench isolation about each semiconductor photodetector; and an air cavity under at least one semiconductor photodetector in the substrate, wherein a pitch of the set of diffraction gratings associated with each pixel in the array of pixels are different to enable each pixel to detect a specific wavelength of light different than other pixels of the array of pixels such that the array of pixels absorbs greater than one wavelength of light.

An aspect of the disclosure related to a method, comprising: forming an array of pixels on a substrate, by: forming an array of semiconductor photodetectors on a substrate, the array of semiconductor photodetectors surrounded by a trench isolation; and forming a set of diffraction gratings directly on each semiconductor photodetector to create the array of pixels, wherein a pitch of the set of diffraction gratings associated with each semiconductor photodetector is different to enable each pixel to detect a specific wavelength of light different than other pixels of the array of pixels.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
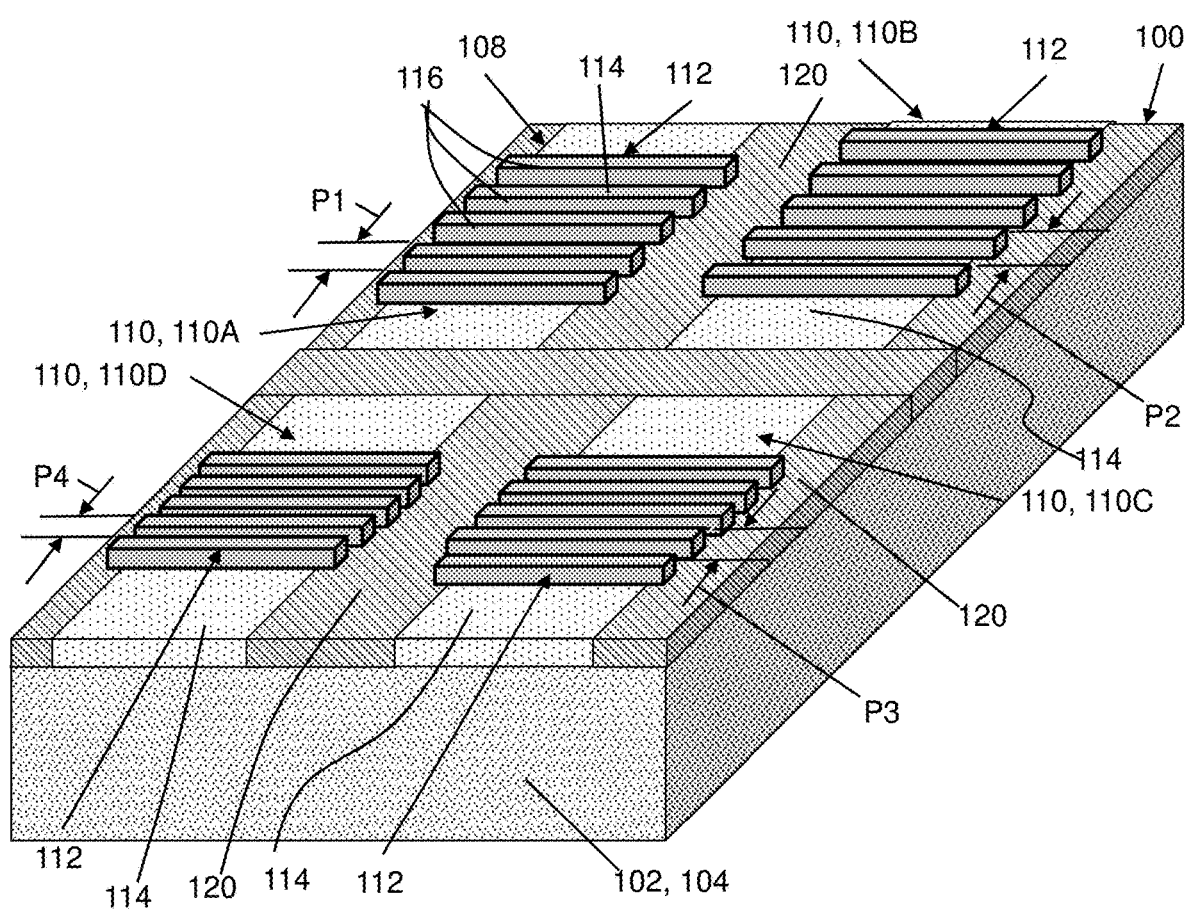
FIG. 1 shows a perspective view of a photodetector array with sets of diffraction gratings with different pitches, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a photodetector array that includes a substrate, and an array of pixels over the substrate. Each pixel includes a set of diffraction gratings directly on a semiconductor photodetector. Hence, the diffraction gratings are integrated with the semiconductor photodetector. A pitch of the set of diffraction gratings associated with each pixel in the array of pixels are different, which enables each pixel to detect a specific wavelength of light different than other pixels of the array of pixels. The semiconductor photodetector can thus be used as an optical de-multiplexer. An air cavity may be provided in the substrate under the semiconductor photodetector to improve light absorption. A method of forming the photodetector array is also disclosed. The semiconductor photodetector can be used as part of a photonic integrated circuit (PIC) on complementary metal-oxide semiconductor (CMOS)-compatible semiconductor photonic chips, potentially including integrated electronics.

Figure 2:
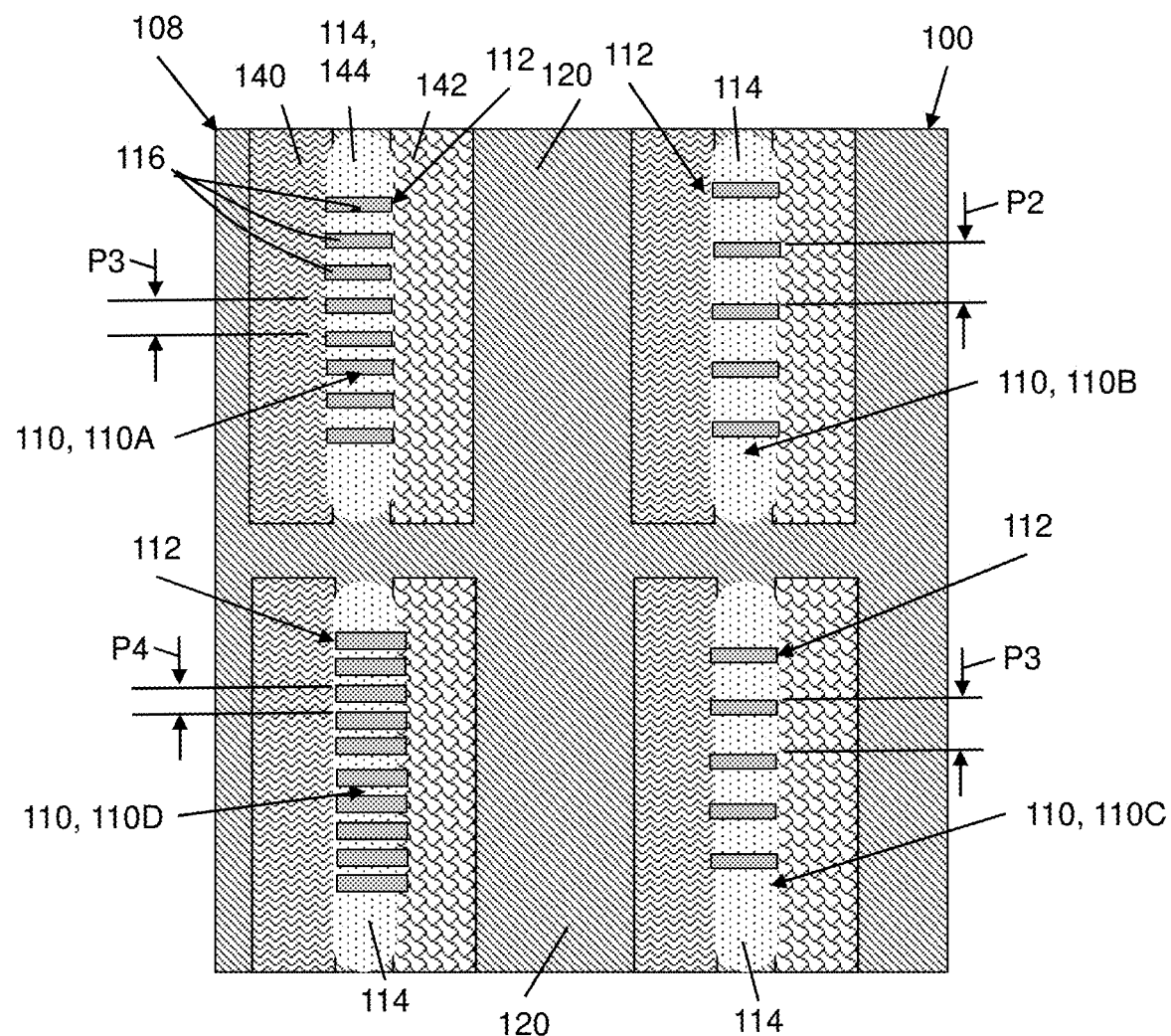
FIG. 2 shows a plan view of a photodetector array similar to that in FIG. 1, but including a semiconductor photodetector with doped regions, according to embodiments of the disclosure.

FIG. 1 shows a perspective view and FIG. 2 shows a plan view of a photodetector array 100 according to embodiments of the disclosure. Photodetector array 100 may include a substrate 102. Substrate 102 may include a semiconductor substrate 104 that may include but is not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Z_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. While not shown, other regions of substrate 102 may include any variety of integrated electronics thereon, e.g., transistors, resistors, capacitors, inductors, etc., and any variety of interconnects.

Photodetector array 100 may also include an array of pixels 108 over substrate 102. For purposes of description, four pixels 110A-D are shown in an array. It is emphasized that any number of pixels 110 may be provided in an array according to embodiments of the disclosure. Pixels 110 may be arranged in any desired manner. Each pixel 110 includes a set of diffraction gratings 112 directly on a semiconductor photodetector 114. A diffraction grating is an optical device with periodic grating elements 116 that split and diffract an optical signal, e.g., light, into several separate beams depending on wavelength. The pitch P1-P4 of a set of diffraction gratings 112 is the spacing between the individual grating elements 116. The pitch of the diffraction grating determines the wavelength of the optical signal that can pass therethrough to be absorbed and converted to an electric signal by semiconductor photodetector 114. Semiconductor photodetector 114 may include but is not limited to: germanium (Ge), silicon (Si), or silicon germanium (SiGe). In accordance with embodiments of the disclosure, pitches P1-P4 of set of diffraction gratings 112 associated with each pixel 110A-D in array of pixels 108 are different to enable each pixel 110 to detect a specific wavelength of light different than other pixels 110 of array of pixels 108. For example, pixel 110D may have a pitch of 390 nanometers (nm), pixel 110C may have a pitch of 400 nm, and pixel 110B may have a pitch of 410 nm. Array of pixels 108 thus may absorb greater than one wavelength of light. In this manner, photodetector array 100 can act as an optical de-multiplexer, isolating any number of desired specific wavelengths of light.

Each set of diffraction gratings 112 may include grating elements 116 including silicon or polysilicon. Sets of diffraction gratings 112 may be formed with other layers of the selected material as part of formation of integrated electronics in other regions of substrate 102. Each pixel 110 may be optically and electrically separated from an adjacent pixel 110 by a trench isolation 120. Trench isolations 120 may be formed of any currently-known or later developed substance for providing electrical and/or optical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 3:
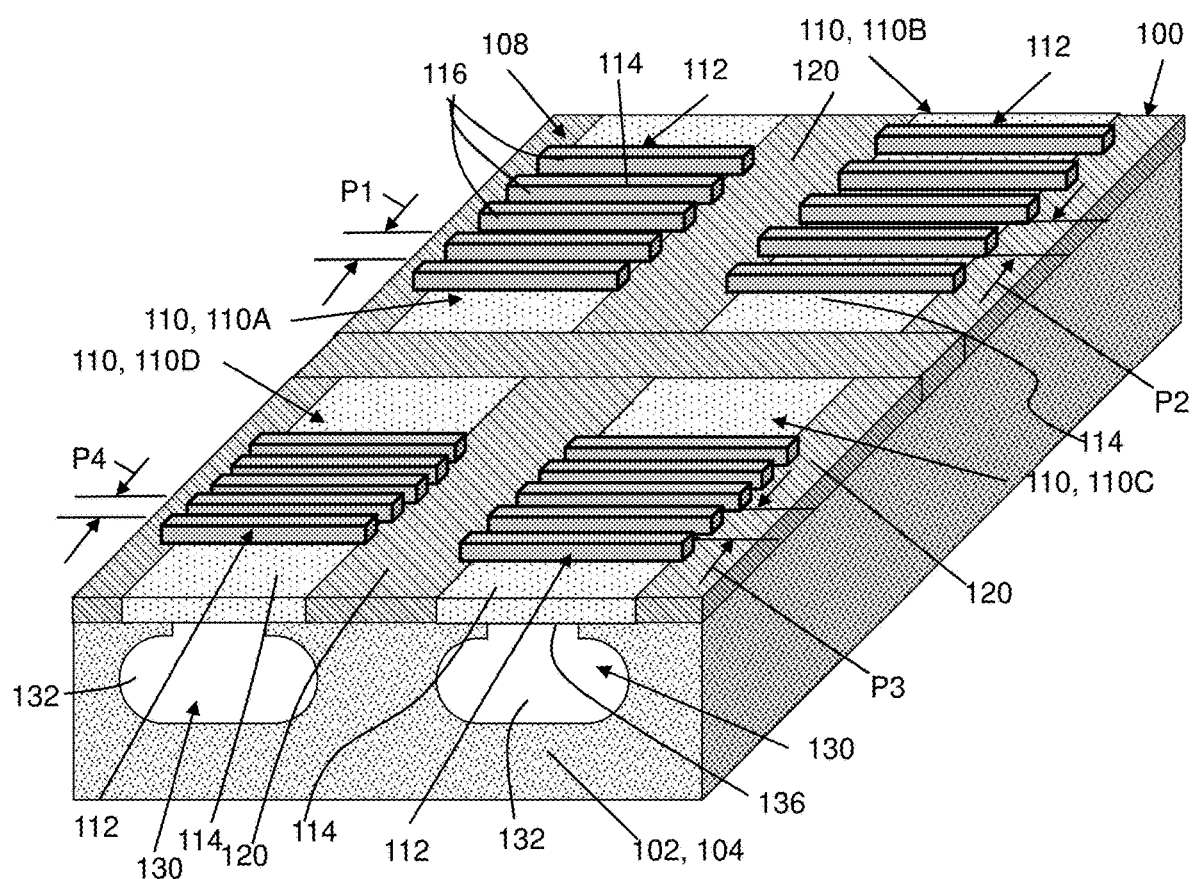
FIG. 3 shows a perspective view of a photodetector array with sets of diffraction gratings with different pitches and an air cavity thereunder, according to other embodiments of the disclosure.
Figure 4:
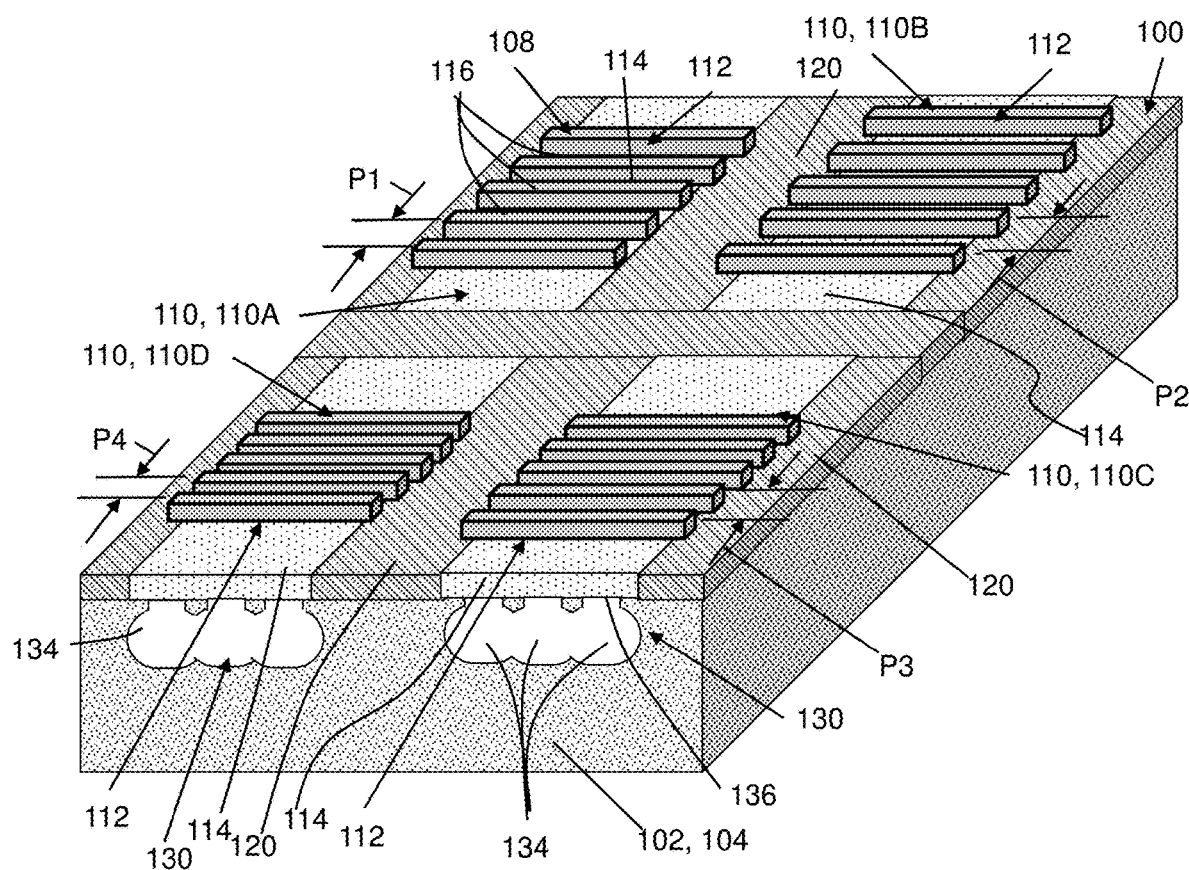
FIG. 4 shows a perspective view of a photodetector array with sets of diffraction gratings with different pitches and an air cavity thereunder, according to yet other embodiments of the disclosure.
Figure 5:
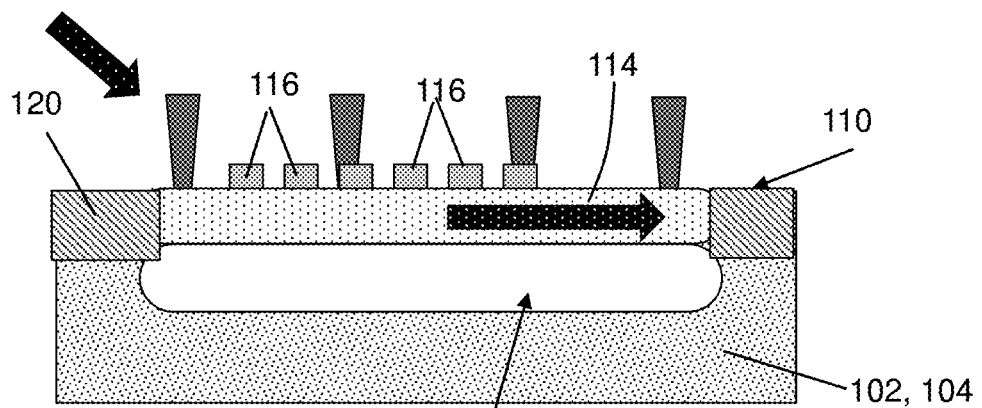
FIG. 5 shows a cross-sectional view of a pixel of the photodetector array, according to embodiments of the disclosure.

FIGS. 3-4 show perspective views of an embodiment of photodetector array 100 including an optional air cavity 130 under at least one semiconductor photodetector 114 in substrate 102. FIG. 3 shows air cavity 130 as a single, unitary air cavity 132 in substrate 102, and FIG. 4 shows air cavity 130 as a plurality of connected air cavities 134. Air cavity 130 receives light passing through semiconductor photodetector(s) 114 and reflects light back toward semiconductor photodetector(s) 114 for additional absorption by an underside 136 of semiconductor photodetector(s) 114. The wavelength of light reflected is as already selected by set of diffraction gratings 112. As shown in FIGS. 1-4, semiconductor photodetector 114 is planar. FIG. 5 shows an enlarged cross-sectional view of a pixel 110 (as in FIG. 3) showing incident light being directed in a planar manner through planar semiconductor photodetector 114. In this manner, as shown by arrows in FIG. 5, light incident on pixels 110 does not need to be perpendicular thereto, and is transmitted parallel to substrate 102. That is, incident light of the targeted wavelength that is coming from out-of-plane (i.e., not from a laser or waveguide in-line with the photodetector array) is redirected to travel in-plane with semiconductor photodetector 114. The incident light can be (preferably) perpendicular to the surface of the photodetector array, but it is not required to be so.

While FIG. 5 shows pixel 110 with air cavity 130, it is emphasized that the teachings of FIG. 5 can be applied to any embodiment, e.g., the FIG. 1 embodiment that is devoid of air cavity 130 or, as in FIG. 4, where air cavity 130 includes a plurality of connected air cavities 134.

Figure 6:
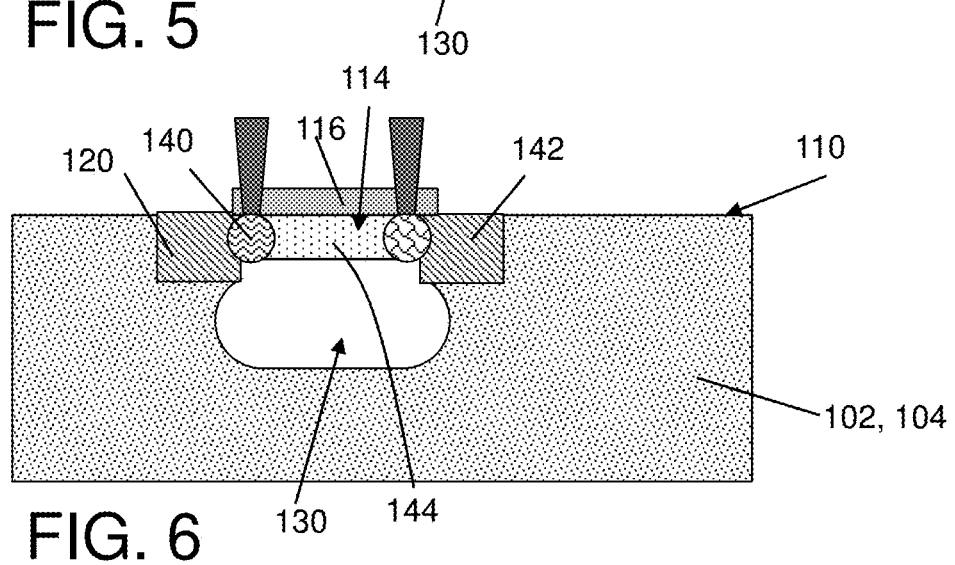
FIG. 6 shows a cross-sectional view of a pixel including a PIN semiconductor photodetector, according to alternative embodiments of the disclosure.
Figure 7:
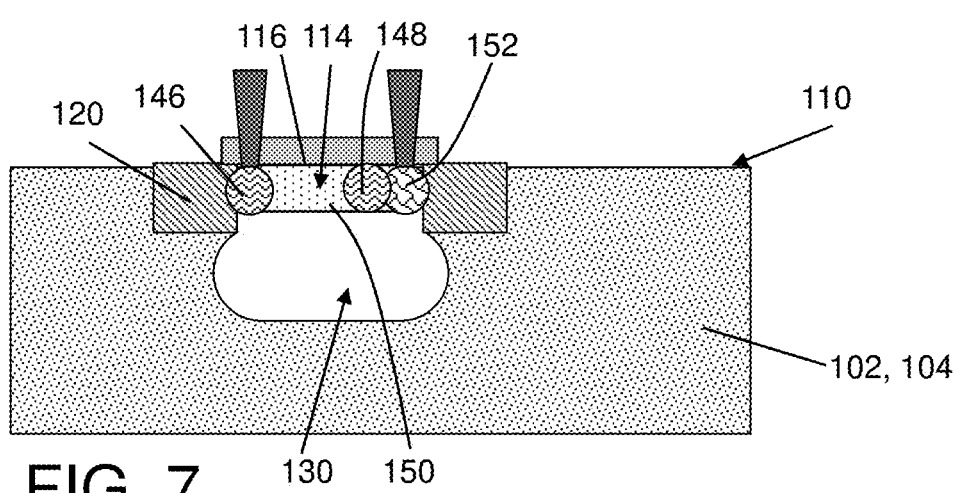
FIG. 7 shows a cross-sectional view of an avalanche photodetector pixel including a PIPN semiconductor photodetector, according to alternative embodiments of the disclosure.
Figure 8:
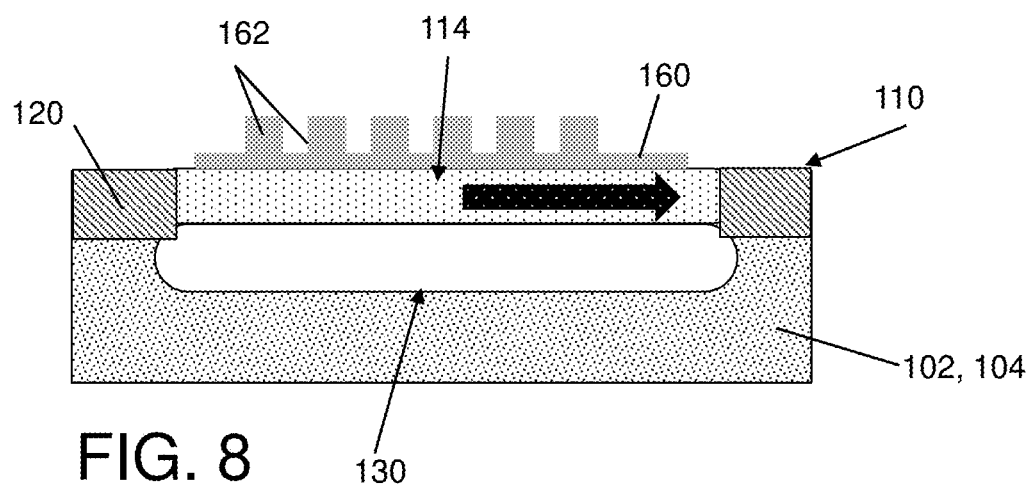
FIG. 8 shows a cross-sectional view of a pixel with a set of diffraction gratings over a base layer, according to alternative embodiments of the disclosure.

FIGS. 6-9 show enlarged cross-sectional views of pixels 110, according to a number of alternative embodiments. FIGS. 2 and 6 show pixel 110 with semiconductor photodetector 114 thereof including a p-type doped region 140 separated from an n-type doped region 142 by an intrinsic region 144 (undoped). A p-type, intrinsic, and n-type doped regions 140, 144, 142 (forming a PIN junction) may be desirable for at least one pixel 110 in array of pixels 108 to form a photodetector, i.e., allow the detection of current created by the absorption of incoming photons of the appropriate wavelength. FIG. 7 shows pixel 110 with semiconductor photodetector 114 including a first p-type doped region 146 separated from a second p-type doped region 148 by an intrinsic region 150, and an n-type doped region 152 adjacent one of first and second p-type doped regions 146, 148 (148 as shown). A p-type, intrinsic, p-type and n-type doped regions 146, 150, 148, 152 (forming a PIPN avalanche photodetector) may be desirable for at least one pixel 110 in array of pixels 108 to from an avalanche photodiode, i.e., allowing the detection of a current (amplified by the P-N junction) created by the absorption of the incoming photons of the appropriate wavelength. FIG. 8 shows a pixel 110 including set of diffraction gratings 112 including a base layer 160 on semiconductor photodetector 114, and a plurality of diffraction grating elements 162 extending from base layer 160. Here, grating elements 162 may be partially etched, leaving base layer 160.

Figure 9:
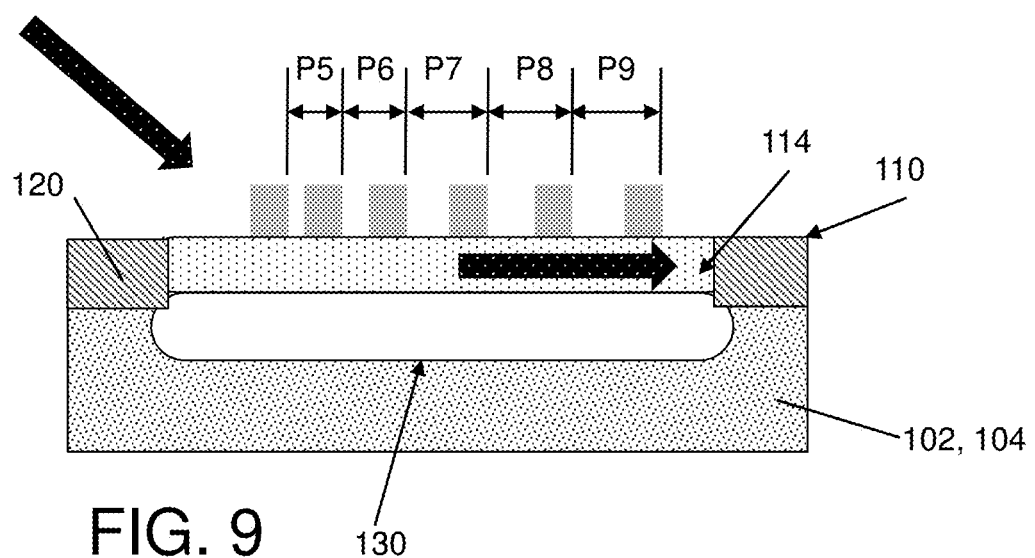
FIG. 9 shows a cross-sectional view of a pixel including a set of diffraction gratings with non-uniform pitch, according to alternative embodiments of the disclosure.

FIG. 9 shows pixel 110 in which the pitch of set of diffraction gratings 112 is non-uniform. In the non-limiting example shown, all of pitches P5-P9 are of different size and are unequal; however, any non-uniform pitch spacing may be employed. A non-uniform pitch may be desirable for at least one pixel 110 in array of pixels 108 to diffract a broader bandwidth of light for the selected pixel(s) 110. In this manner, photodetector array 100 can isolate any number of desired specific bandwidths (wavelength ranges) of light, e.g., 390-400 nm, 420-440 nm, etc., rather than, or in addition to, specific wavelengths of light.

Any number of pixels 110 in an array of pixels 108 may include the alternative embodiments described relative to FIGS. 6-9, e.g., at least one. While FIGS. 6-9 show pixel 110 with air cavity 130, it is emphasized that the teachings of FIGS. 6-9 can be applied to any embodiment, e.g., the FIG. 1 embodiment that is devoid of air cavity 130 or, as in FIG. 4, where air cavity 130 includes a plurality of connected air cavities 134.

FIGS. 1-4 and 10-15 show a method of forming photodetector array 100, according to embodiments of the disclosure. More particularly, FIGS. 1-4 and FIGS. 10-15 show forming array of pixels 108 on substrate 102, including a corresponding array of semiconductor photodetectors 114.

Figure 10:
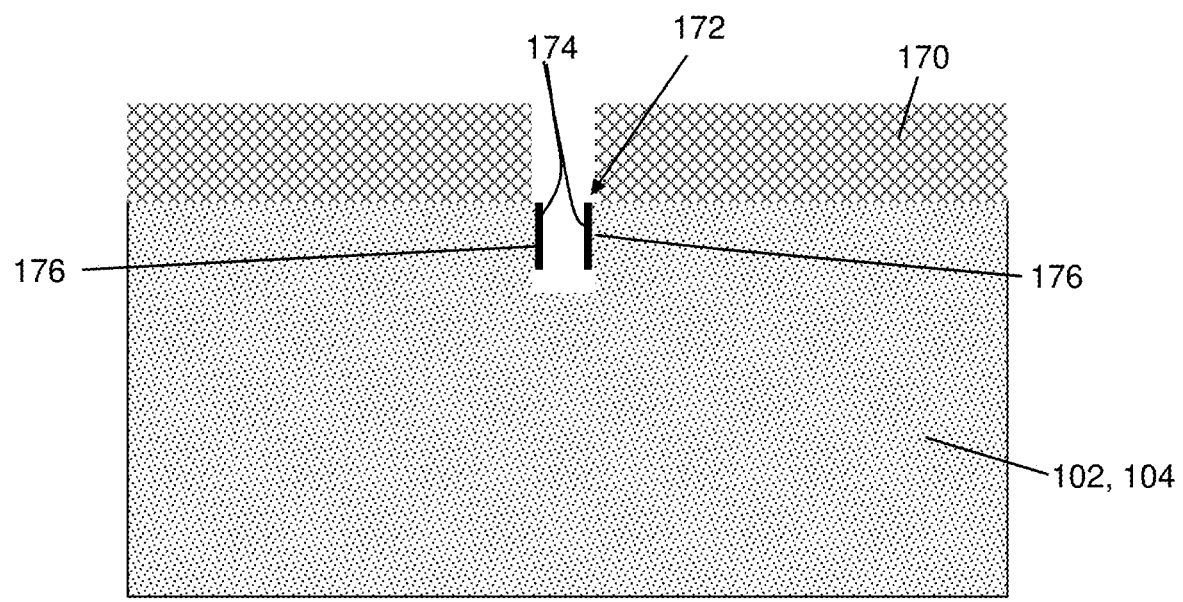
FIG. 10 shows a cross-sectional view of a preliminary structure for a method of forming a photodetector array, according to embodiments of the disclosure.

FIGS. 10-14 show cross-sectional views of optionally forming, prior to forming the array of semiconductor photodetectors 114, an array of air cavities 130 in substrate 102. FIG. 10 shows a preliminary structure including substrate 102 having a hardmask 170 patterned thereover, and forming of a preliminary cavity opening 172. Hardmask 170 may include any now known or later developed hardmask material, e.g., silicon nitride, and may be patterned using any technique such a mask exposure, and etching. Opening 172 may be formed by additional etching into substrate 102.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, a RIE may be used.

FIG. 10 also shows formation of a liner oxide 174 in preliminary cavity opening 172. Liner oxide 174 may be formed by, for example, oxide thermal growth or deposition, and a directional etch to remove a lower portion of the liner oxide. The latter etching leaves oxide liner 174 only on sidewalls 176 of preliminary cavity opening 172. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, ALD may be used for oxide liner 174.

Figure 11:
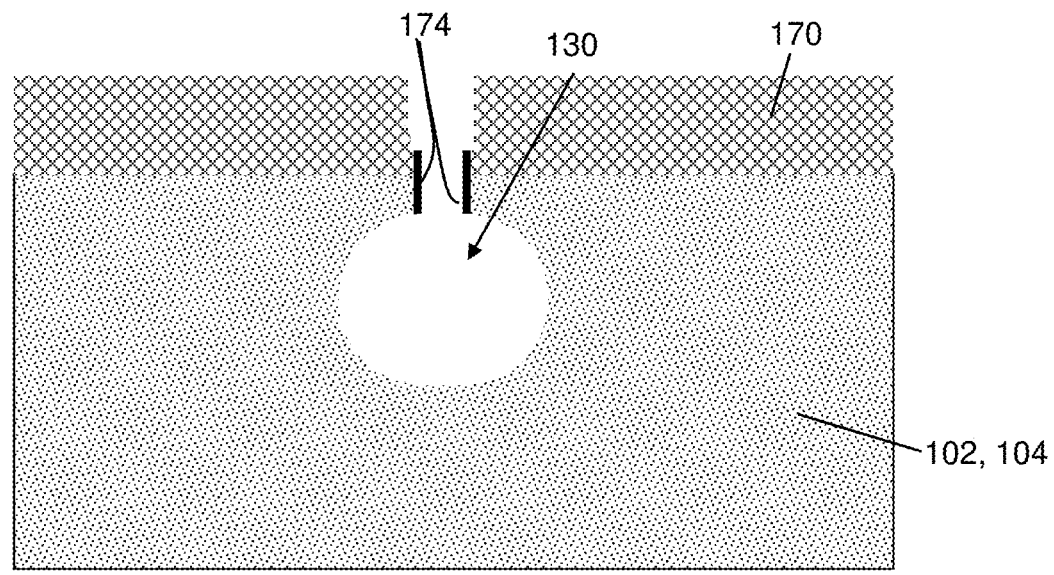
FIG. 11 shows a cross-sectional view of forming an air cavity in the preliminary structure, according to embodiments of the disclosure.

After a bottom cleaning that partially enlarges opening 172 below oxide liner 174, as shown in FIG. 11, additional etching creates air cavity 130. Here, the etching may include a non-directional wet etch.

Figure 12:
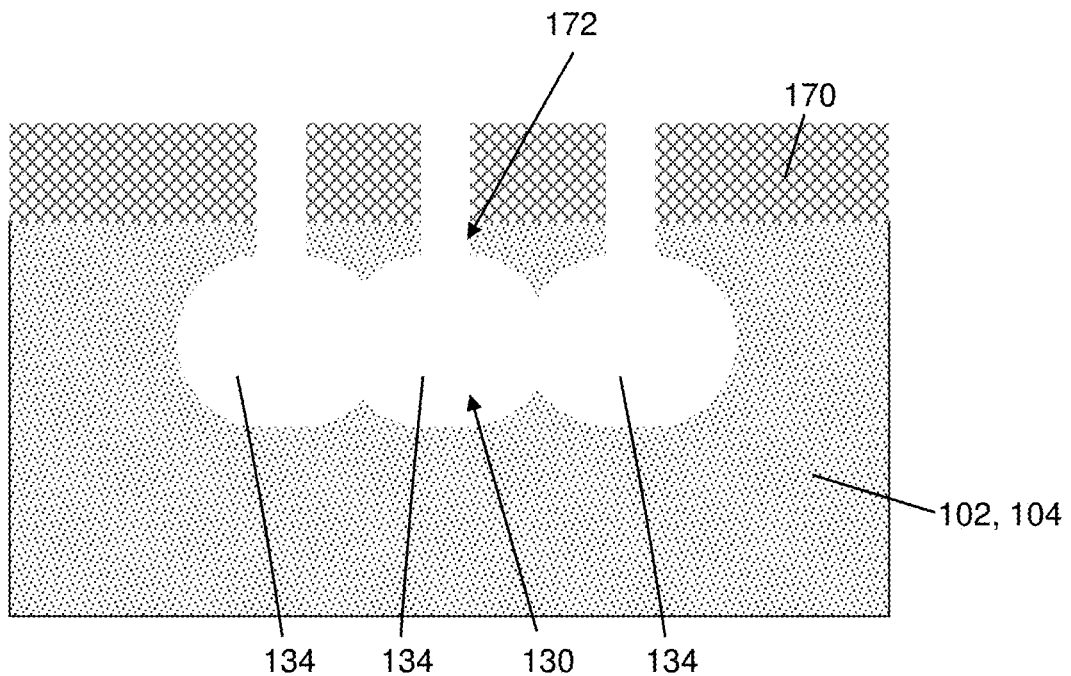
FIG. 12 shows a cross-sectional view of forming an air cavity with a plurality of connected air cavities, according to embodiments of the disclosure.

FIG. 12 shows an optional embodiment in which forming air cavity 130 includes forming a plurality of connected air cavities 134. Here, connected air cavities 134 are created by simultaneously repeating the above processing described relative to FIGS. 10 and 11 at a number of locations to create a number of adjacent, connected air cavities 134.

Figure 13:
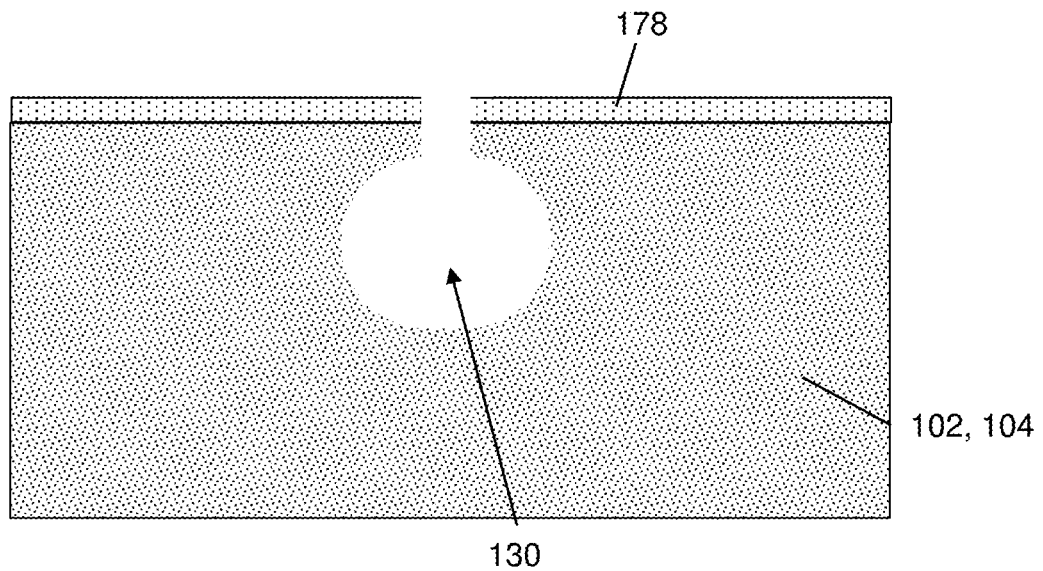
FIG. 13 shows a cross-sectional view of forming a semiconductor photodetector layer, according to embodiments of the disclosure.
Figure 14:
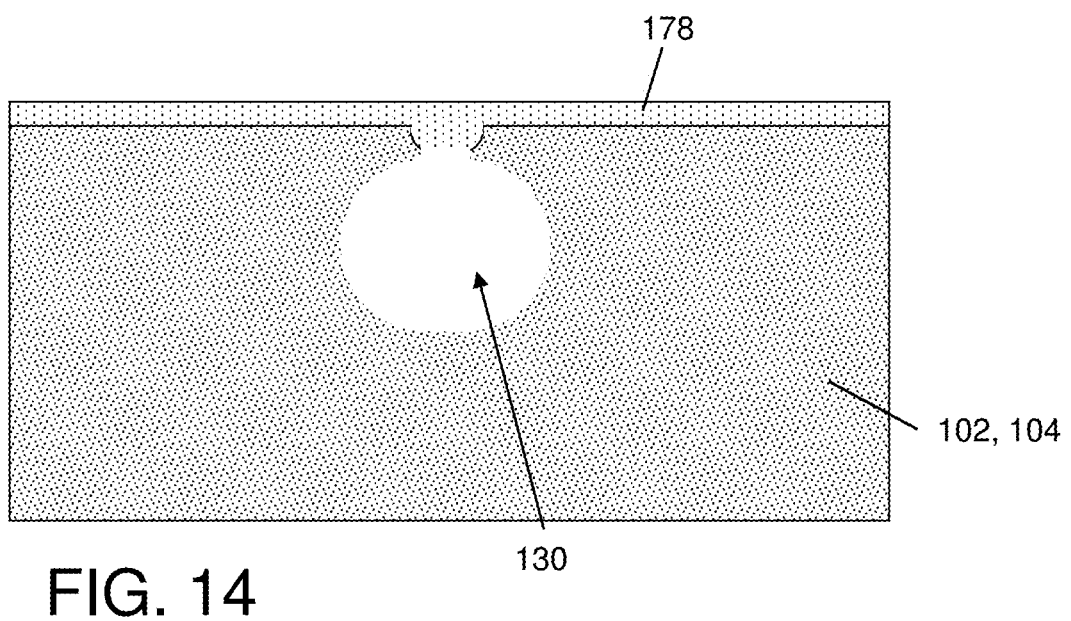
FIG. 14 shows a cross-sectional view of sealing an air cavity, according to embodiments of the disclosure.

FIGS. 1, 13-15 show forming an array of semiconductor photodetectors 114. FIG. 13 shows forming a germanium layer 178 after removing hardmask 170 (FIG. 11) and removing oxide liner 174 (FIG. 11). Hardmask 170 and oxide liner 174 may be removed using any appropriate stripping process, e.g., ashing. Germanium layer 178 may be formed, for example, by deposition or epitaxial growth. FIG. 14 shows thermally annealing germanium layer 178, which causes it to plug or seal opening 172 (FIG. 10) of an air cavity 130 in substrate 102. In this manner, each semiconductor photodetector 114 may be formed over a respective air cavity 130. It will be recognized that where air cavity 130 is not provided, then germanium layer 178 is simply formed as described herein over substrate 102.

Figure 15:
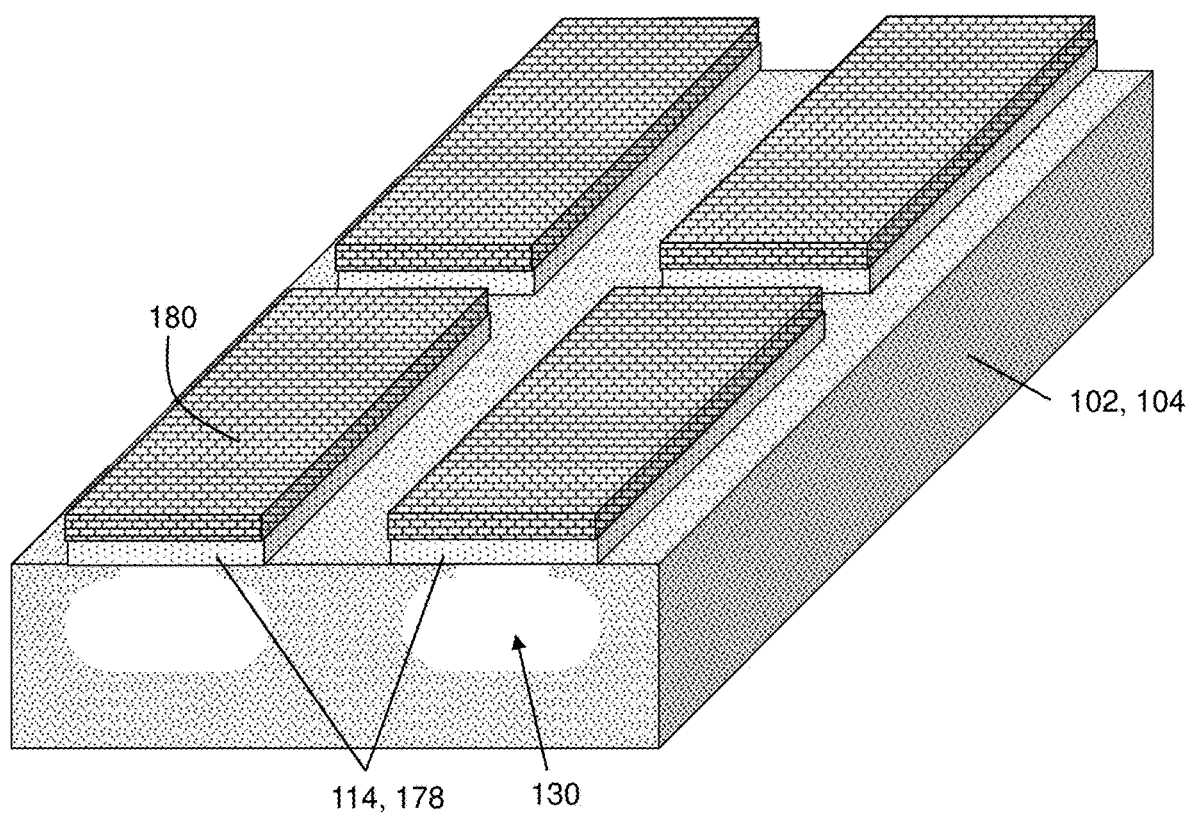
FIG. 15 shows a perspective view of a patterning the semiconductor photodetector layer for an array of pixels, according to embodiments of the disclosure.

FIG. 15 shows a perspective view of forming a hard mask 180 over germanium layer 178, and etching to pattern semiconductor photodetectors 114. The etching may also include etching trenches (not shown) for trench isolations 120 (FIG. 1). As shown in FIG. 1, trench isolations 120 may be formed about semiconductor photodetectors 114. Trench isolation 120 may be etched into germanium layer 178 and substrate 102 and filled with an insulating material such as oxide, to isolate semiconductor photodetectors 114 and eventually pixels 110 from each other. A planarization may remove any excess insulating material over germanium layer 178. As understood in the art, trench isolations 120 may also isolate other regions of substrate 102 from adjacent regions of the substrate, e.g., to isolate different transistors. Each trench isolation 120 may be formed of any currently-known or later developed substance for providing electrical insulation, as previously listed herein.

FIG. 1 shows forming a set of diffraction gratings 112 directly on each semiconductor photodetector 114 to create array of pixels 108, i.e., there is no intervening structure between set of diffraction gratings 112 and semiconductor photodetectors 114. Sets of diffraction gratings 112 may be formed as part of processing of, for example, transistor gates in other regions on substrate 102. Here, layer(s) of material for set of diffusion gratings 112 may be deposited, e.g., by ALD as part of transistor gate layer formation, and patterned and etched to create grating elements 116 with the desired pitches P1-P4. In one embodiment, diffraction gratings 112 may include a single material such as but not limited to polysilicon, silicon or a metal gate conductor such as copper. In other embodiments, diffraction gratings 112 may include a number of layers such as polysilicon or silicon, either with a gate dielectric such as silicon oxide; or a metal gate material including one or more layers of work function metals and gate conductors, and with a gate dielectric layer such as silicon oxide. In certain embodiments, diffraction gratings 112 may include any layer(s) used in the gates (not shown) of transistors (active or dummy) in other regions of the wafer.

As noted, a pitch of the set of diffraction gratings 112 associated with each semiconductor photodetector 114 may be different to enable each pixel 110 to detect a specific wavelength of light different than other pixels 110 of the array of pixels 108. Sets of diffraction gratings 112 may include, for example, silicon or polysilicon. Ends of each diffraction grating element 116 may be aligned with an edge of a respective semiconductor photodetector 114, or one or more elements may extend onto trench isolations 120 adjacent to a respective semiconductor photodetector 114. Pitches created may be any of those described relative to embodiments described herein, e.g., such as those shown in FIGS. 1, 2, 8 and 9.

In alternative embodiments, shown in FIG. 6, prior to forming sets of diffraction gratings 112 and as part of forming the array of semiconductor photodetectors 114, at least one semiconductor photodetector 114 may be formed with p-type doped region 140 separated from n-type doped region 142 by intrinsic region 144. Here, any appropriate masks may be formed, and the desired regions doped with the desired dopant, e.g., using ion implantation Illustrative n-type dopants may include but are not limited to: phosphorous (P), arsenic (As), antimony (Sb); and illustrative p-type dopants may include but are not limited to: boron (B), indium (In) and gallium (Ga). Similarly, in another alternative embodiment, as shown in FIG. 7, forming the array of semiconductor photodetectors 114 may include forming at least one semiconductor photodetector 114 with first p-type doped region 146 separated from second p-type doped region 148 by intrinsic region 150, and n-type doped region 152 adjacent one of the first and second p-type doped regions. This structure forms a PIPN avalanche photodetector.

The method may also include forming at least one set of diffraction gratings 112 with a pitch that is non-uniform, as shown in FIG. 9, e.g., using the patterning to generate the different pitches. Similarly, as shown in FIG. 8, the method may include forming at least one set of diffraction gratings 112 with base layer 160 on semiconductor photodetector 114 and a plurality of diffraction grating elements 162 extending from base layer 160. Here, grating elements 162 are only partially etched from the diffraction grating layer.

The method as described above is used in the fabrication of photonic integrated circuit chips (PICs). The resulting PICs can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes PICs and/or integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a substrate;
   an array of pixels over the substrate, each pixel including a set of diffraction gratings directly on a semiconductor photodetector; and
   an air cavity under at least one semiconductor photodetector in the substrate;
   wherein a pitch of the set of diffraction gratings associated with each pixel in the array of pixels are different to enable each pixel to detect a specific wavelength of light different than other pixels of the array of pixels.

2. The structure of claim 1, wherein the air cavity includes a plurality of connected air cavities.

3. The structure of claim 1, wherein each set of diffraction gratings includes one of polysilicon and silicon.

4. The structure of claim 1, wherein the semiconductor photodetector comprises germanium (Ge), silicon (Si), or silicon germanium (SiGe).

5. The structure of claim 1, wherein at least one semiconductor photodetector includes a p-type doped region separated from an n-type doped region by an intrinsic region.

6. The structure of claim 1, wherein at least one semiconductor photodetector includes a first p-type doped region separated from a second p-type doped region by an intrinsic region, and an n-type doped region adjacent one of the first and second p-type doped regions.

7. The structure of claim 1, wherein the pitch of the set of diffraction gratings for at least one pixel of the array of pixels is non-uniform.

8. The structure of claim 1, wherein the set of diffraction gratings includes a base layer on the semiconductor photodetector and a plurality of diffraction grating elements extending from the base layer.

9. The structure of claim 1, wherein the array of pixels absorbs greater than one wavelength of light.

10. A structure, comprising:
    a substrate;
    an array of pixels over the substrate, each pixel including a set of diffraction gratings directly on a semiconductor photodetector, wherein each set of diffraction gratings includes one of poly silicon and silicon;
    a trench isolation about each semiconductor photodetector; and
    an air cavity under at least one semiconductor photodetector in the substrate,
    wherein a pitch of the set of diffraction gratings associated with each pixel in the array of pixels are different to enable each pixel to detect a specific wavelength of light different than other pixels of the array of pixels such that the array of pixels absorbs greater than one wavelength of light.

11. The structure of claim 10, wherein each air cavity includes a plurality of connected air cavities.

12. The structure of claim 10, wherein at least one semiconductor photodetector includes a p-type doped region separated from an n-type doped region by an intrinsic region.

13. The structure of claim 10, wherein at least one semiconductor photodetector includes a first p-type doped region separated from a second p-type doped region by an intrinsic region, and an n-type doped region adjacent one of the first and second p-type doped regions.

14. The structure of claim 10, wherein the pitch of the set of diffraction gratings for at least one pixel of the array of pixels is non-uniform.

15. The structure of claim 10, wherein the set of diffraction gratings includes a base layer on the semiconductor photodetector and a plurality of diffraction grating elements extending from the base layer.

16. A method, comprising:
    forming an array of pixels on a substrate, by:
    forming an array of semiconductor photodetectors on a substrate, the array of semiconductor photodetectors surrounded by a trench isolation; and
    forming a set of diffraction gratings directly on each semiconductor photodetector to create the array of pixels, wherein a pitch of the set of diffraction gratings associated with each semiconductor photodetector is different to enable each pixel to detect a specific wavelength of light different than other pixels of the array of pixels.

17. The method of claim 16, further comprising, prior to forming the array of semiconductor photodetectors, forming an array of air cavities in the substrate, wherein forming the array of semiconductor photodetectors includes forming each semiconductor photodetector over a respective air cavity, the semiconductor photodetector sealing the respective air cavity.

18. The method of claim 16, wherein forming the array of semiconductor photodetectors includes forming at least one semiconductor photodetector with a p-type doped region separated from an n-type doped region by an intrinsic region.

19. The method of claim 16, wherein forming the array of semiconductor photodetectors includes forming at least one semiconductor photodetector with a first p-type doped region separated from a second p-type doped region by an intrinsic region, and an n-type doped region adjacent one of the first and second p-type doped regions.

\* \* \* \* \*